(12) United States Patent
Tian

(10) Patent No.: US 9,465,247 B2
(45) Date of Patent: Oct. 11, 2016

(54) COMPOSITION FOR BLACK MATRIXES, METHOD FOR PREPARING THE SAME, DISPLAY PANEL AND DISPLAY DEVICE

(71) Applicant: BOE TECHNOLOGY GROUP CO., LTD., Beijing (CN)

(72) Inventor: Xiaoxiong Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/548,993

(22) Filed: Nov. 20, 2014

(65) Prior Publication Data

US 2016/0018695 A1    Jan. 21, 2016

(30) Foreign Application Priority Data

Jul. 17, 2014   (CN) .......................... 2014 1 0340606

(51) Int. Cl.
| | | |
|---|---|---|
| G02F 1/00 | (2006.01) | |
| H01L 27/00 | (2006.01) | |
| G02F 1/1335 | (2006.01) | |
| G02F 1/1368 | (2006.01) | |

(52) U.S. Cl.
CPC ....... *G02F 1/133512* (2013.01); *G02F 1/1368* (2013.01); *G02F 1/133514* (2013.01)

(58) Field of Classification Search
CPC .................. G02F 1/133512; G02F 1/133514; G02F 1/1368; H01L 27/1218; H01L 27/3295; H01L 27/3246; H01L 27/328
See application file for complete search history.

(56) References Cited

U.S. PATENT DOCUMENTS

| | | | | |
|---|---|---|---|---|
| 5,121,762 A | * | 6/1992 | DiPinto | A61K 8/46 |
| | | | | 132/204 |
| 7,537,810 B2 | * | 5/2009 | Hayashi | G02B 5/223 |
| | | | | 428/1.1 |
| 8,168,689 B2 | * | 5/2012 | Weng | C09B 67/0002 |
| | | | | 252/582 |
| 8,613,511 B2 | * | 12/2013 | Hakiri | C09D 11/324 |
| | | | | 347/100 |
| 2006/0229376 A1 | * | 10/2006 | Hayashi | G02B 5/223 |
| | | | | 522/6 |
| 2012/0026237 A1 | * | 2/2012 | Hakiri | C09D 11/324 |
| | | | | 347/20 |
| 2015/0060745 A1 | * | 3/2015 | Liao | G02B 1/04 |
| | | | | 252/586 |

OTHER PUBLICATIONS

Mitsubishi Chemical Carbon Black Specification (see at http://www.carbonblack.jp/en/product/list2_01.html published on Jul. 18, 2007).*

* cited by examiner

*Primary Examiner* — Nikolay Yushin
(74) *Attorney, Agent, or Firm* — Nath, Golberg & Meyer; Joshua B. Goldberg

(57) ABSTRACT

There are disclosed a composition for black matrixes, a method for preparing the same, a display panel and a display device. The method for preparing said composition for black matrixes includes pigment dispersion forming process comprising the following steps: stirring the mixture of a carbon black, a dispersion agent, a solvent and a resin having a developing property until well mixed, and then performing a first shaking; adding the solvent continuously, or further adding the resin having a developing property, and performing a second shaking; adding the solvent continuously, and performing a third shaking to obtain the pigment dispersion; wherein, during at least one of the three shakings, a resin for improving the viscosity and the granularity stability was added therein. The obtained black matrixes has a higher electrical conductivity, thus the defects at the time of booting in the current display device can be further reduced or even avoided.

12 Claims, 1 Drawing Sheet

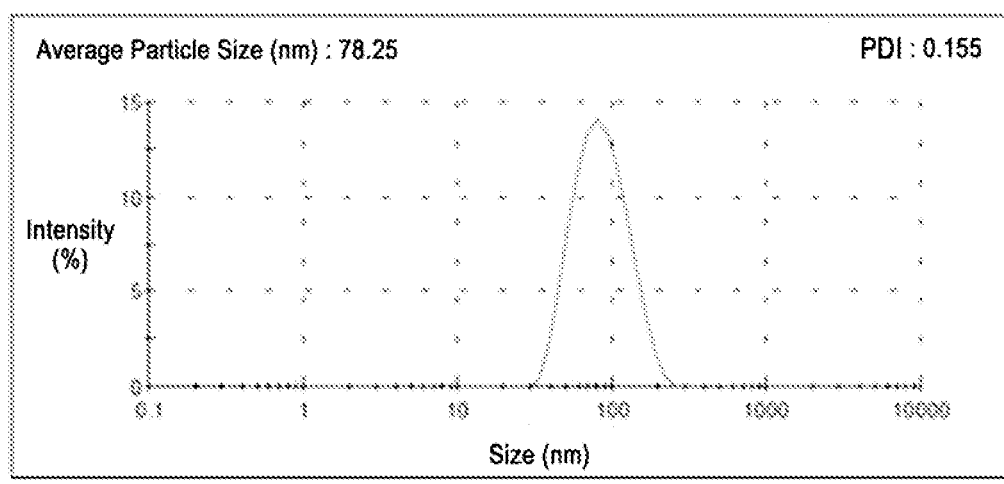

COMPOSITION FOR BLACK MATRIXES, METHOD FOR PREPARING THE SAME, DISPLAY PANEL AND DISPLAY DEVICE

FIELD OF THE INVENTION

The present invention relates to the technical field of display, in particular, to a composition for black matrixes and a method for preparing the same, as well as a display panel and a display device using the same.

BACKGROUND OF THE INVENTION

Liquid Crystal Display (LCD) devices have currently become the dominant product in the field of display due to its superior performance.

An LCD device generally comprises a color filter (CF) substrate, an array substrate, and a liquid crystal layer disposed therebetween. In order to realize the display of an image, a thin film transistor (TFT) is provided in the array substrate. The TFT is connected to gate lines and data lines respectively to receive control signal and display signal according to which the ON/OFF of the TFT is controlled, thereby the drive of the Liquid crystal is realized and the deflection of the liquid crystal is controlled, furthermore such that the light is controlled. Meanwhile, in order to achieve the color display of an image, inside of the CF substrate, there is provided color filter layers of different colors that are separated by black matrixes (simply referred to as BM). In order to achieve a larger aperture ratio of pixels, the black matrixes usually overlap the gate lines and the data lines in spatial position.

During the operation of liquid crystal display devices, the display is performed through the deflection of the liquid crystal caused by the electrical field generated from the electrode which is connected to the TFT. However, since the gate lines-loaded signal in the array substrate changes abruptly at the instant of booting, an instantaneous induced electrical field is generated between the electrode lead region of the array substrate and the corresponding black matrixes of the CF substrate. The induced charge generated transports to the display area through the black matrixes, forming an interference electric field which will cause the rotation of the liquid crystal molecules, and thus affect the overall deflection of the liquid crystal, thereby resulting in defects at the time of booting. For example, defects such as white lines and the like appear at the time of booting of the LCD device that adopts the Advanced Super Dimension Switch (ASDS, also known as ADSDS) technique.

SUMMARY OF THE INVENTION

In view of the above-described problems in the prior art, an object of the present invention is to provide a composition for black matrixes and a method for preparing the same, as well as a display panel and a display device comprising the shading structure formed by the black matrixes, thus endowing the shading structure formed from the composition for black matrixes on CF substrate and/or array substrate with a higher charge transport capability, such that the induced charge can be transferred timely and efficiently, and the defects such as white lines and the like resulted from the induced technical field at the time of booting in the current display device can be further reduced or even avoided.

In one aspect, the present invention provides a composition for black matrixes (also referred to as black matrixes glue) comprising a pigment dispersion having an average particle size of the pigment dispersion in the range of 50 nm to 80 nm and a substrate, wherein the pigment dispersion comprising carbon black, a solvent, a dispersion agent, a resin having a developing property, and a resin for improving the viscosity and the granularity stability of the obtained pigment dispersion.

Preferably, the carbon black accounts for 13-17 parts by mass, the solvent accounts for 60-64 parts by mass, the dispersion agent accounts for 8-12 parts by mass, the resin having a developing property accounts for 9-13 parts by mass, and the resin for improving the viscosity and the granularity stability accounts for 1-3 parts by mass, with respect to a total of 100 parts by mass of the pigment dispersion.

Preferably, the carbon black is C27 or C69; the solvent is propylene glycol methyl ether acetate; the dispersion agent is an additive having high molecular weight for wetting and dispersing the pigment; the resin having a developing property is 161; and the resin for improving the viscosity and the granularity stability is A81.

Preferably, the substrate comprises an alkali-soluble resin, an initiator, a leveling agent, a monomer and a defoamer.

In another aspect, the present invention provides a method for preparing a composition for black matrixes comprising a step of forming a pigment dispersion which comprises:

stirring the mixture of a carbon black, a dispersion agent, a solvent and a resin having a developing property until well mixed, and then performing a first shaking;

adding the solvent continuously or further adding the resin having a developing property, and performing a second shaking;

adding the solvent continuously, and performing a third shaking to obtain the pigment dispersion;

wherein, during at least one of the above three shakings, a resin for improving the viscosity and the granularity stability is added therein.

Preferably, the pigment dispersion has an average particle size in a range of 50 nm to 80 nm.

Preferably, the carbon black accounts for 13-17 parts by mass, the solvent accounts for 60-64 parts by mass, the dispersion agent accounts for 8-12 parts by mass, the resin having a developing property accounts for 9-13 parts by mass, and the resin for improving the viscosity and the granularity stability accounts for 1-3 parts by mass, with respect to a total of 100 parts by mass of the pigment dispersion.

Preferably, the carbon black is C27 or C69; the solvent is propylene glycol methyl ether acetate; the dispersion agent is an additive having high molecular weight for wetting and dispersing the pigment; the resin having a developing property is 161; and the resin for improving the viscosity and the granularity stability is A81.

Preferably, the shaking time for the first shaking is in a range of 1 to 2 h; the shaking time for the second shaking is in a range of 0.5 to 1 h; the shaking time for the third shaking is in a range of 3 to 5 h.

Preferably, the shaking is performed by a shaker, the shaking culture-flask of which is placed with zirconia beads in advance, and the amount of the zirconia beads is half of the total mass of the pigment dispersion.

Preferably, the method for preparing a composition for black matrixes further comprises a step of mixing the pigment dispersion with an alkali-soluble resin, an initiator, a leveling agent, a monomer and a defoamer homogeneously.

In yet another aspect, the present invention provides a display panel comprising a CF substrate and an array substrate which are assembled and aligned, wherein the CF substrate and/or the array substrate comprises a shading structure formed from the above-described composition for black matrixes.

Preferably, the shading structure has an electrical resistivity in a range of $1 \times 10^{-9}$ Ω·m to $10 \times 10^{-9}$ Ω·m. More preferably, the electrical resistivity of the shading structure is $6.2 \times 10^{-9}$ Ω·m.

In yet another aspect, the present invention provides a display device comprising the above-described display panel.

The composition for black matrixes according to the present invention has a higher electrical conductivity, thus endowing the shading structure formed from the composition for black matrixes on CF substrate and/or array substrate with a higher charge transport capability, such that the induced charge can be transferred timely and efficiently so as to overcome the problem that the induced charge remains. Therefore, the display device having such a shading structure have a better resistance to the interference electric field, as a result, the defects such as white lines and the like resulted from the induced technical field at the time of booting in the current display device can be further reduced or even avoided.

BRIEF DESCRIPTION OF THE DRAWINGS

FIG. 1 is a schematic view showing the particle size distribution (PSD) of the pigment dispersion according to Example 2 of the present invention.

DETAILED DESCRIPTION OF CERTAIN EMBODIMENTS

The composition for black matrixes and a method for preparing the same, as well as a display panel and a display device of the present invention will be described in detail with reference to the accompanying figures, so that a person skilled in the art can get a better understanding of the technical solutions of the invention.

An embodiments according to the present invention provides a composition for black matrixes comprising a pigment dispersion having an average particle size of the pigment dispersion in the range of 50 nm to 80 nm and a substrate, wherein the pigment dispersion comprising carbon black, a solvent, a dispersion agent, a resin having a developing property, and a resin for improving the viscosity and the granularity stability of the obtained pigment dispersion.

Preferably, the carbon black accounts for 13-17 parts by mass, the solvent accounts for 60-64 parts by mass, the dispersion agent accounts for 8-12 parts by mass, the resin having a developing property accounts for 9-13 parts by mass, and the resin for improving the viscosity and the granularity stability accounts for 1-3 parts by mass, with respect to a total of 100 parts by mass of the pigment dispersion.

The carbon black may be any carbon black pigment conventionally used for preparing a composition for black matrixes; preferably the carbon black is a carbon black pigment having electrical conductivity; more preferably is C27 and/or C69. The solvent may be any solvent which can reduce the viscosity of the pigment dispersion provisionally and which is desirable for applying the pigment dispersion onto a substrate, for example propylene glycol methyl ether acetate (simple referred as PGMEA) and ethyl ethoxypropionate (simple referred as EEP); preferably, the solvent is PGMEA. The dispersion agent is used to disperse the carbon black pigment uniformly into the pigment dispersion, and it may be an additive having high molecular weight for wetting and dispersing the pigment, such as BYK161, BYK2000, BYK2001, BYK6919, Ajinomoto 8 series, Lubrizol 24000, and Lubrizol 21324. The resin having a developing property is used to increase the accuracy during the preparation of a shading structure from the composition for black matrixes, and it may comprise acrylic polymer; preferably, this resin is 161. The resin for improving the viscosity and the granularity stability may be any resin that can improve the viscosity and the granularity stability; preferably, this resin is A81.

Preferably, the substrate comprises an alkali-soluble resin, an initiator, a leveling agent, a monomer and a defoamer.

The composition for black matrixes according to this embodiment has finer particles and more uniform particle size distribution, thus it has a higher electrical conductivity and a better conductive performance.

Another embodiment according to the present invention provides a method for preparing a composition for black matrixes comprising a step of forming a pigment dispersion which comprises:

stirring the mixture of a carbon black, a dispersion agent, a solvent and a resin having a developing property until well mixed, and then performing a first shaking, preferably the shaking time for the first shaking is in a range of 1 to 2 h;

adding the solvent continuously, or further adding the resin having a developing property, and performing a second shaking, preferably the shaking time for the second shaking is in a range of 0.5 to 1 h;

adding the solvent continuously, and performing a third shaking to obtain the pigment dispersion, preferably the shaking time for the third shaking is in a range of 3 to 5 h;

wherein, during at least one of the above three shakings, a resin for improving the viscosity and the granularity stability was added therein.

Preferably, the pigment dispersion has an average particle size in a range of 50 nm to 80 nm.

In the present embodiment, the carbon black as a pigment is used to provide the composition with color, and may be any carbon black pigment that is conventionally used; preferably, the carbon black is a carbon black pigment having electrical conductivity; more preferably is C27 and/or or C69. The carbon black accounts for 13 to 17 parts by mass, with respect to a total of 100 parts by mass of the pigment dispersion. In the case where the amount of the carbon black is constant, the smaller the particle size of the pigment dispersion is, the more uniform the pigment dispersion will be and the better electrical conductivity will be, due to the fact that C27 and C69 is electrically conductive.

The solvent may be any solvent which can reduce the viscosity of the pigment dispersion provisionally and which is desirable for applying the pigment dispersion onto a substrate, for example PGMEA and EEP; preferably, the solvent is propylene glycol methyl ether acetate. The solvent accounts for 60-64 parts by mass with respect to a total of 100 parts by mass of the pigment dispersion. The molecule of the solvent has both an ether bond and alkyl groups as well as carbonyl (present in ester structure), i.e. the molecular has both non-polar portion and polar portion, the functional groups of which interact with each other (repulsion) while playing respective inherent roles, thus the solvent can dissolve both non-polar substance and polar substance to a certain extent.

The dispersion agent is used for dispersing the carbon black pigment homogeneously into the pigment dispersion, which may be an additive having high molecular weight for wetting and dispersing the pigment, such as BYK-2000 (manufactured by BYK Additives & Instruments, Germany). The dispersion agent accounts for 8-12 parts by mass with respect to a total of 100 parts by mass of the pigment dispersion. The dispersion agent can prevent the coagulation of the pigment due to its steric hindrance effect, such that the average particle size of the pigment is smaller and thereby the glossiness, tinting power, transparency and hiding power thereof can be improved. Moreover, the dispersion agent can reduce the viscosity and improve the leveling property, such that a pigment dispersion with higher amount of pigment can be obtained.

The resin having a developing property is used to increase the accuracy during the preparation of a shading structure from the composition for black matrixes, and it preferably is 161. The resin having a developing property accounts for 9-13 parts by mass with respect to a total of 100 parts by mass of the pigment dispersion.

The resin for improving the viscosity and the granularity stability may be A81 that accounts for 1-3 parts by mass with respect to the pigment dispersion.

Preferably, the shaking is performed by a shaker, the shaking culture-flask of which is placed with zirconia beads having a particle size of 0.1 mm to 0.3 mm in advance, and the amount of the zirconia beads is half of the total mass of the pigment dispersion. The particle size of the pigment dispersion largely depends on the amount of the zirconia bead as a grinding medium adding into the shaking culture-flask. If the amount of the zirconia beads is too large, it will result an undue grinding wherein the particle size is so small that a pasty pigment dispersion which is difficult to disperse, will be obtained. If the amount of the zirconia beads is too small, it will result an insufficient grinding wherein the particle size is so large that the electrical conductivity of the composition for black matrixes will be influenced. After many modeling and testing, the amount of the zirconia beads is a half of the total mass of the pigment dispersion in this embodiment, based on the process of three shaking. Of course, it should be understood that the amount of the zirconia beads can be adjusted according to the different conditions of the shaking (for example the different shaking time) so as to achieve a suitable particle size of the pigment dispersion.

During the process of first shaking, the carbon black and dispersion agent must be added into the shaking culture-flask.

The resin having a developing property for increasing the accuracy during the preparation of a shading structure may be added completely during the first shaking, or could be added in batches during the first and second shaking while keeping the total mass thereof the same.

The solvent may be added during the first, second or third shaking while keeping the total mass thereof the same.

The resin for improving the stability of the pigment dispersion system may be added in batches during the first and second shaking, or the second and third shaking, or could be added completely during the third shaking, while keeping the total mass thereof the same.

Adding each component in batches facilitates the sufficient wetting and dispersion between the components. Furthermore, since the relative position of each component are different, adding in batches can contribute to making the components disperse more uniformly, such that the steric location of each component is disposed more reasonable and the effect of each component can be maximized. In practice, the steps can be adjusted according to the condition of equipments and preparation.

After completing the preparation of the pigment dispersion, it can be well mixed with an alkali-soluble resin, an initiator, a leveling agent, a monomer and a defoamer so as to obtain a composition for black matrixes, wherein the alkali-soluble resin, the initiator, the leveling agent, the monomer and the defoamer can be selected with reference to the composition for black matrixes in prior art, and it need not to be repeated herein.

Another embodiment according to the present invention provides a display panel comprising a CF substrate and an array substrate which are assembled and aligned, wherein the CF substrate and/or the array substrate comprises a shading structure made from the above-described composition for black matrixes.

In the present embodiment, a black matrix is prepared from the composition for black matrixes by a conventional method in the prior art, which comprises applying the composition for black matrixes on a substrate and forming a black matrix (BM) by process such as prebake, exposure, development, etc. Then a red (R) filter film, a green (G) filter film and a blue (B) filter film, as well as an outside cover (OC) layer and a transparent electrode layer (made of ITO) and the like, are prepared in sequence on the obtained BM so as to obtain a CF substrate.

Of course, the composition for black matrixes according to the present invention also can be applied in the area of an array substrate where shading is required (generally in the area overlapped with data lines or grid lines) or to prevent the reflection.

In the prior art, the shading structure (for example a black matrix) made from a conventional composition for black matrixes generally has an electrical resistivity of less than $10 \times 10^{-9}$ Ω·m. The shading structure made from the composition for black matrixes according to the present invention has an electrical resistivity in a range of $1 \times 10^{-9}$ Ω·m to $10 \times 10^{-9}$ Ω·m; preferably an electrical resistivity of $6.2 \times 10^{-9}$ Ω·m. Compared with the conventional shading structure, the shading structure made from the composition for black matrixes according to the present invention has a better electrical conductivity and can transport the induced charge effectively.

It should be understood that, liquid crystals are always disposed between the CF substrate and array substrate in a LCD panel. When a CF substrate is comprising the BM made from the above composition for black matrixes, the BM can transport efficiently and timely the induced charge of the induced electrical field which is generated at the instant of booting the LCD panel, so as to prevent the induced charge from entering into the display region and influencing the deflection of the liquid crystal, thereby the influence on the deflection of the liquid crystal due to the induced charge residue can be further reduced or even avoided.

Another embodiment according to the present invention provides a LCD device comprising the above-described display panel. The display device may be any product or parts having a display function, such as a displayer, electronic paper, mobile phones, tablet computers, televisions, laptop computers, digital picture frames, navigation systems and the like.

Since the CF substrate and/or array substrate of the LCD device comprises the shading structure formed from the composition for black matrixes having higher electrical conductivity, the shading structure have a higher charge transport capability, such that the induced charge can be transferred timely and efficiently so as to overcome the problem that the induced charge remains. Therefore, the display device having such a shading structure have a better resistance to the interference electric field, as a result, the defects such as white lines and the like resulted from the induced technical field at the time of booting in the current display device can be further reduced or even avoided, especially for the ADS-type LCD devices.

EXAMPLES

Herein, the particle size is measured by a Malvern Mastersizer 2000 (manufactured by Malvern Instruments Ltd.); the viscosity is measured with a rotor under a temperature of 25° C. and a rotate speed of 10 rpm by a viscosity meter RVF-100 (manufactured by Brookfield Ltd.). Unless otherwise noted, the shakings in the following examples all performed under room temperature.

Example 1

A composition for black matrixes is provided in this example and the method for preparing it comprises the following steps.
1) Preparation of the Pigment Dispersion
Adding 13 g of C27 and 2 g of C69 into a mixture of 10 g of dispersion agent PYK-2000, 11 g of 161 and 42 g of PGMEA in a shaking culture-flask placed with 50 g zirconia beads, and further adding 1 g of A81 resin under stirring;
Performing the first shaking in a shaker for 1.5 h, and then taking out the shaking culture-flask and adding 10 g of PGMEA therein;
Shaking again for 0.5 h, adding 10 g of PGMEA and 1 g of A81 resin;
Shaking continuously for 4 h and taking out the shaking culture-flask. The obtained pigment dispersion has a viscosity of 4.67 cp and the particle size distribution is shown in FIG. 1.
The evaluation parameter of the pigment dispersion includes the particle size and the polydispersity index (PDI). As shown in FIG. 1, the Z-Average of the PSD is a single peak, wherein the particle size (diameter) is concentrated around 78.25 nm and the PDI is 0.155. This indicates the number of particles having particle size in the above range is relatively large, and the PSD is uniform.
2) Preparation of the Composition for Black Matrixes
The composition for black matrixes is obtained by mixing the pigment dispersion in this example with an alkali-soluble resin, an initiator, a leveling agent, a monomer and a defoamer.

Example 2

A composition for black matrixes is provided in this example and the method for preparing it comprises the following steps.
1) Preparation of the Pigment Dispersion
Adding 12.5 g of C27 and 2.5 g of C69 into a mixture of 11 g of dispersion agent PYK-2000, 11 g of 161 and 41 g of PGMEA in a shaking culture-flask placed with 50 g zirconia beads, and further adding 1 g of A81 resin under stirring;
Performing the first shaking in a shaker for 1.5 h, and then taking out the shaking culture-flask and adding 10 g of PGMEA therein;
Shaking again for 0.5 h, adding 10 g of PGMEA and 1 g of A81 resin;
Shaking continuously for 4 h and taking out the shaking culture-flask. The obtained pigment dispersion has a viscosity of 4.72 cp.
2) Preparation of the Composition for Black Matrixes
The composition for black matrixes is obtained by mixing the pigment dispersion in this example with an alkali-soluble resin, an initiator, a leveling agent, a monomer and a defoamer.

Example 3

A composition for black matrixes is provided in this example and the method for preparing it comprises the following steps.
1) Preparation of the Pigment Dispersion
Adding 13 g of C27 and 2 g of C69 into a mixture of 10 g of dispersion agent PYK-2000, 10 g of 161 and 40 g of PGMEA in a shaking culture-flask placed with 50 g zirconia beads, and further adding 1 g of A81 resin under stirring;
Performing the first shaking in a shaker for 1.5 h, and then taking out the shaking culture-flask and adding 1 g of 161 and 12 g of PGMEA therein;
Shaking again for 0.5 h, adding 10 g of PGMEA and 1 g of A81 resin;
Shaking continuously for 4 h and taking out the shaking culture-flask. The obtained pigment dispersion has a viscosity of 4.63 cp.
2) Preparation of the Composition for Black Matrixes
The composition for black matrixes is obtained by mixing the pigment dispersion in this example with an alkali-soluble resin, an initiator, a leveling agent, a monomer and a defoamer.

Example 4

A composition for black matrixes is provided in this example and the method for preparing it comprises the following steps.
1) Preparation of the Pigment Dispersion
Adding 13 g of C27 and 2 g of C69 into a mixture of 10 g of dispersion agent PYK-2000, 11 g of 161 and 42 g of PGMEA in a shaking culture-flask placed with 50 g zirconia beads;
Performing the first shaking in a shaker for 1.5 h, and then taking out the shaking culture-flask and adding 1 g of A81 and 10 g of PGMEA therein;
Shaking again for 0.5 h, adding 10 g of PGMEA and 1 g of A81 resin;
Shaking continuously for 4 h and taking out the shaking culture-flask. The obtained pigment dispersion has a viscosity of 4.26 cp.
2) Preparation of the Composition for Black Matrixes
The composition for black matrixes is obtained by mixing the pigment dispersion in this example with an alkali-soluble resin, an initiator, a leveling agent, a monomer and a defoamer.

Example 5

A composition for black matrixes is provided in this example and the method for preparing it comprises the following steps.
1) Preparation of the Pigment Dispersion
Adding 14 g of C27 and 1 g of C69 into a mixture of 9 g of dispersion agent PYK-2000, 8 g of 161 and 43 g of PGMEA in a shaking culture-flask placed with 50 g zirconia beads;

Performing the first shaking in a shaker for 1.5 h, and then taking out the shaking culture-flask and adding 3 g of 161 and 10 g of PGMEA therein;

Shaking again for 0.5 h, adding 10 g of PGMEA and 2 g of A81 resin; Shaking continuously for 4 h and taking out the shaking culture-flask. The obtained pigment dispersion has a viscosity of 4.17 cp.

2) Preparation of the Composition for Black Matrixes

The composition for black matrixes is obtained by mixing the pigment dispersion in this example with an alkali-soluble resin, an initiator, a leveling agent, a monomer and a defoamer.

It should be understood that the present invention is not limited to the above-illustrated embodiments, which were chosen and described in order to best explain the principles of the invention. Those skilled in the art can make various modifications or variations without departing from the spirit and essence of the present invention. The scope of the invention is intended to be defined by the following claims and their equivalents.

The invention claimed is:

1. A method for preparing a composition for black matrixes including pigment dispersion forming process, characterized in that, said pigment dispersion forming process comprising the following steps:
    stirring the mixture of a carbon black, a dispersion agent, a solvent and a resin having a developing property until well mixed, and then performing a first shaking;
    adding the solvent continuously, or further adding the resin having a developing property, and performing a second shaking;
    adding the solvent continuously, and performing a third shaking to obtain the pigment dispersion;
    wherein, during at least one of the three shakings, a resin for improving a viscosity and a granularity stability was added therein;
    an average particle size of the pigment dispersion is in a range of 50 nm to 80 nm; and
    the carbon black is C27 or C69; the solvent is propylene glycol methyl ether acetate; the dispersion agent is an additive having high molecular weight for wetting and dispersing the pigment; the resin having a developing property is 161; and the resin for improving the viscosity and the granularity stability is A81.

2. The method for preparing a composition for black matrixes according to claim 1, characterized in that, the carbon black accounts for 13-17 parts by mass; the solvent accounts for 60-64 parts by mass; the dispersion agent accounts for 8-12 parts by mass; the resin having a developing property accounts for 9-13 parts by mass; and the resin for improving the viscosity and the granularity stability accounts for 1-3 parts by mass, with respect to a total of 100 parts by mass of the pigment dispersion.

3. The method for preparing a composition for black matrixes according to claim 1, characterized in that, the shaking time for the first shaking is in a range of 1 to 2 h; the shaking time for the second shaking is performed for 0.5 to 1 h; the shaking time for the third shaking is performed for 3 to 5 h.

4. The method for preparing a composition for black matrixes according to claim 1, characterized in that, the shaking is performed by adopting a shaker, wherein the shaking culture-flask thereof is placed with zirconia beads in advance, and the amount of the zirconia beads is a half of the total mass of the pigment dispersion.

5. The method for preparing a composition for black matrixes according to claim 1, characterized in that, further comprising a step of mixing the pigment dispersion with an alkali-soluble resin, an initiator, a leveling agent, a monomer and a defoamer homogeneously.

6. A composition for black matrixes comprising pigment dispersion and substrate, characterized in that, said pigment dispersion comprising carbon black, a solvent, a dispersion agent, a resin having a developing property, and a resin for improving viscosity and a granularity stability of the obtained pigment dispersion, an average particle size of the pigment dispersion is in a range of 50 nm to 80 nm; the carbon black is C27 or C69; the solvent is propylene glycol methyl ether acetate; the dispersion agent is an additive having high molecular weight for wetting and dispersing the pigment the resin having a developing property is 161; and the resin for improving the viscosity and the granularity stability is A81.

7. The composition for black matrixes according to claim 6, characterized in that, the carbon black accounts for 13-17 parts by mass; the solvent accounts for 60-64 parts by mass; the dispersion agent accounts for 8-12 parts by mass; the resin having a developing property accounts for 9-13 parts by mass; and the resin for improving the viscosity and the granularity stability accounts for 1-3 parts by mass, with respect to a total of 100 parts by mass of the pigment dispersion.

8. The composition for black matrixes according to claim 6, characterized in that, said substrate comprises an alkali-soluble resin, an initiator, a leveling agent, a monomer and a defoamer.

9. A display panel comprising a Color Filter (CF) substrate and an array substrate which are assembled and aligned, characterized in that, said CF substrate and/or the array substrate comprises a shading structure formed from a composition for black matrixes comprising a pigment dispersion and a substrate; wherein said pigment dispersion comprising carbon black, a solvent, a dispersion agent, a resin having a developing property, and a resin for improving viscosity and a granularity stability of the obtained pigment dispersion; an average particle size of the pigment dispersion is in a range of 50 nm to 80 nm; the carbon black is C27 or C69; the solvent is propylene glycol methyl ether acetate; the dispersion agent is an additive having high molecular weight for wetting and dispersing the pigment the resin having a developing property is 161; and the resin for improving the viscosity and the granularity stability is A81.

10. The display panel according to claim 9, characterized in that, the electrical resistivity of the shading structure is in a range of $1 \times 10^{-9}$ $\Omega \cdot m$ to $10 \times 10^{-9}$ $\Omega \cdot m$.

11. The display panel according to claim 10, characterized in that, the electrical resistivity of the shading structure is $6.2 \times 10^{-9}$ $\Omega \cdot m$.

12. A display device, characterized in that, comprising a display panel which comprises a Color Filter (CF) substrate and an array substrate that are assembled and aligned, wherein the CF substrate and/or the array substrate comprises a shading structure formed from a composition for black matrixes comprising a pigment dispersion and a substrate; wherein said pigment dispersion comprising carbon black, a solvent, a dispersion agent, a resin having a developing property, and a resin for improving a viscosity and a granularity stability of the obtained pigment dispersion; an average particle size of the pigment dispersion is in a range of 50 nm to 80 nm; the carbon black is C27 or C69; the solvent is propylene glycol methyl ether acetate; the dispersion agent is an additive having high molecular weight for wetting and dispersing the pigment the resin having a developing property is 161; and the resin for improving the viscosity and the granularity stability is A81.

\* \* \* \* \*